United States Patent
Yang

(10) Patent No.: US 9,691,800 B2
(45) Date of Patent: Jun. 27, 2017

(54) IMAGE SENSOR AND ELECTRONIC DEVICE HAVING THE SAME

(71) Applicant: SK hynix Inc., Gyeonggi-do (KR)

(72) Inventor: Yun-Hui Yang, Gyeonggi-do (KR)

(73) Assignee: SK HYNIX Inc., Gyeonggi-do (KR)

( * ) Notice: Subject to any disclaimer, the term of this patent is extended or adjusted under 35 U.S.C. 154(b) by 196 days.

(21) Appl. No.: 14/818,740

(22) Filed: Aug. 5, 2015

(65) Prior Publication Data
US 2016/0351605 A1    Dec. 1, 2016

(30) Foreign Application Priority Data

May 27, 2015   (KR) .......................... 10-2015-0073847

(51) Int. Cl.
| | |
|---|---|
| *H01L 27/146* | (2006.01) |
| *G01J 1/44* | (2006.01) |
| *G01J 1/02* | (2006.01) |
| *G01J 1/06* | (2006.01) |
| *G01J 3/02* | (2006.01) |
| *G01J 1/04* | (2006.01) |

(52) U.S. Cl.
CPC ...... *H01L 27/14607* (2013.01); *G01J 1/0209* (2013.01); *G01J 1/0488* (2013.01); *G01J 1/06* (2013.01); *G01J 1/44* (2013.01); *G01J 3/0208* (2013.01); *G01J 3/0259* (2013.01); *G01J 3/0262* (2013.01); *H01L 27/14625* (2013.01); *H01L 27/14621* (2013.01); *H01L 27/14627* (2013.01)

(58) Field of Classification Search
CPC ......... H01L 27/14607; H01L 27/14625; H01L 27/14627; H01L 27/14621; G01J 1/44; G01J 1/06; G01J 1/0488; G01J 3/0208
USPC ....................................................... 250/208.1
See application file for complete search history.

(56) References Cited

U.S. PATENT DOCUMENTS

| | | | |
|---|---|---|---|
| 7,335,963 B2 * | 2/2008 | Ford | ................ H01L 27/14623 257/435 |
| 8,629,930 B2 * | 1/2014 | Brueckner | ........... H04N 5/2254 348/335 |
| 2012/0147228 A1 * | 6/2012 | Duparre | ................ H04N 9/045 348/262 |
| 2012/0261781 A1 * | 10/2012 | Hsu | ................... H01L 27/14623 257/432 |
| 2015/0054103 A1 | 2/2015 | Mackey | |

* cited by examiner

*Primary Examiner* — Seung C Sohn
(74) *Attorney, Agent, or Firm* — IP & T GROUP LLP

(57) ABSTRACT

An image sensor includes a substrate including photoelectric conversion elements for a plurality of unit pixels, which are two-dimensionally arranged in a pixel array; a light transmission member on the substrate; a grid structure in the light transmission member and having multiple layers; and a light collection member on the light transmission member, wherein the grid structure is tilted for respective chief ray angles of the plurality of unit pixels according to locations of the plurality of unit pixels in the pixel array.

20 Claims, 7 Drawing Sheets

IMAGE SENSOR AND ELECTRONIC DEVICE HAVING THE SAME

CROSS-REFERENCE TO RELATED APPLICATIONS

The present application claims priority of Korean Patent Application No. 10-2015-0073847, filed on May 27, 2015, which is incorporated herein by reference in its entirety.

BACKGROUND

Exemplary embodiments of the present invention relate to a semiconductor device fabricating technology, and more particularly, to an image sensor including a grid structure and an electronic device having the same.

An image sensor converts an optical image into electric signals. Recently, with the development of the computer and communication industry, there has been increased demand for image sensors with improved performance in various fields such as digital cameras, camcorders, personal communication systems (PCS), game machines, security cameras, medical micro cameras, robots and the like.

SUMMARY

Various embodiments are directed to an image sensor with improved performance and an electronic device having the same.

In an embodiment, an image sensor may include: a substrate including photoelectric conversion elements for a plurality of unit pixels, which are two-dimensionally arranged in a pixel array; a light transmission member on the substrate; a grid structure in the light transmission member and having multiple layers; and a light collection member on the light transmission member, wherein the grid structure is tilted for respective chief ray angles of the unit pixels according to location in the pixel array. Furthermore, the image sensor may further include a color filter layer between the light transmission member and the light collection member and including a plurality of color filters, wherein respective edges of the plurality of color filters overlap an uppermost layer of the grid structure.

The light transmission member may have multiple layers corresponding to the multiple layers of the grid structure. Each of the multiple layers of the light transmission member may include an insulating material, and wherein refractive indexes of the multiple layers of the light transmission member may be the same. Each of the multiple layers of the light transmission member may include an insulating material, and wherein the multiple layers of the light transmission member having different refractive indexes are stacked such that each of the multiple layers has a larger refractive index toward the photoelectric conversion element. The grid structure located at a center of the pixel array may have vertical sidewalls, and wherein a tilt amount of sidewalls of the grid structure becomes greater as the location of the unit pixels gets further from the center of the pixel array. The grid structure may be located between the unit pixels. A number of the multiple layers of the grid structure may increase as the location of the unit pixels gets further from a center of the pixel array. A line width of the grid structure may decrease as the location of unit pixels gets further from a center of the pixel array. The grid structure may include a metal material. A planer shape of the grid structure may be the same as respective planer shapes of the unit pixels.

In another embodiment, an image sensor may include: a substrate including photoelectric conversion elements for a plurality of unit pixels, which are two-dimensionally arranged in a pixel array; a light transmission member on the substrate; a grid structure in the light transmission member and having a plurality of grid layers; and a light collection member on the light transmission member, wherein a lower grid layer becomes closer to an edge of the pixel array than an upper grid layer as the unit pixels get further from a center the pixel array. Furthermore, the image sensor may further include a color filter layer between the light transmission member and the light collection member and including a plurality of color filters, wherein respective edges of the color filters overlap an uppermost layer of the grid structure.

The grid structure located at the center of the pixel array may have vertical sidewalls, and wherein a tilt amount of sidewalls of the grid structure becomes greater as the unit pixels get further from the center of the pixel array. The grid structure may be located between the unit pixels. A number of the multiple layers the grid structure may increase as the unit pixels get further from the center of the pixel array. A line width of the grid structure may decrease as the unit pixels get further from the center of the pixel array. The grid structure may include a metal material.

In another embodiment, an electronic device may include: an optical system; an image sensor suitable for receiving light from the optical system; and a signal processing unit suitable for performing a signal processing operation on a signal outputted from the image sensor. The image sensor may include: a substrate including photoelectric conversion elements for a plurality of unit pixels, which are two-dimensionally arranged in a pixel array; a light transmission member on the substrate; a grid structure in the light transmission member and having a plurality of grid layers; and a light collection member on the light transmission member, wherein the grid structure is tilted for respective chief ray angles of the unit pixels according to where the plurality of unit pixels are located in the pixel array.

A lower grid layer may be disposed closer to an edge of the pixel array than an upper gird layer among the plurality of the grid layers as the locations of the plurality of unit pixels become further from a center to the edge of the pixel array.

In accordance with exemplary embodiments of the present invention, the pixel array of the image sensor may include a plurality of unit pixels having a grid structure tilted at an angle corresponding to respective chief ray angles (CRAB) of the unit pixels, so that it is possible to improve shading variation. Furthermore, it is possible to prevent crosstalk between adjacent unit pixels, and increase quantum efficiency.

DETAILED DESCRIPTION

Figure 1:
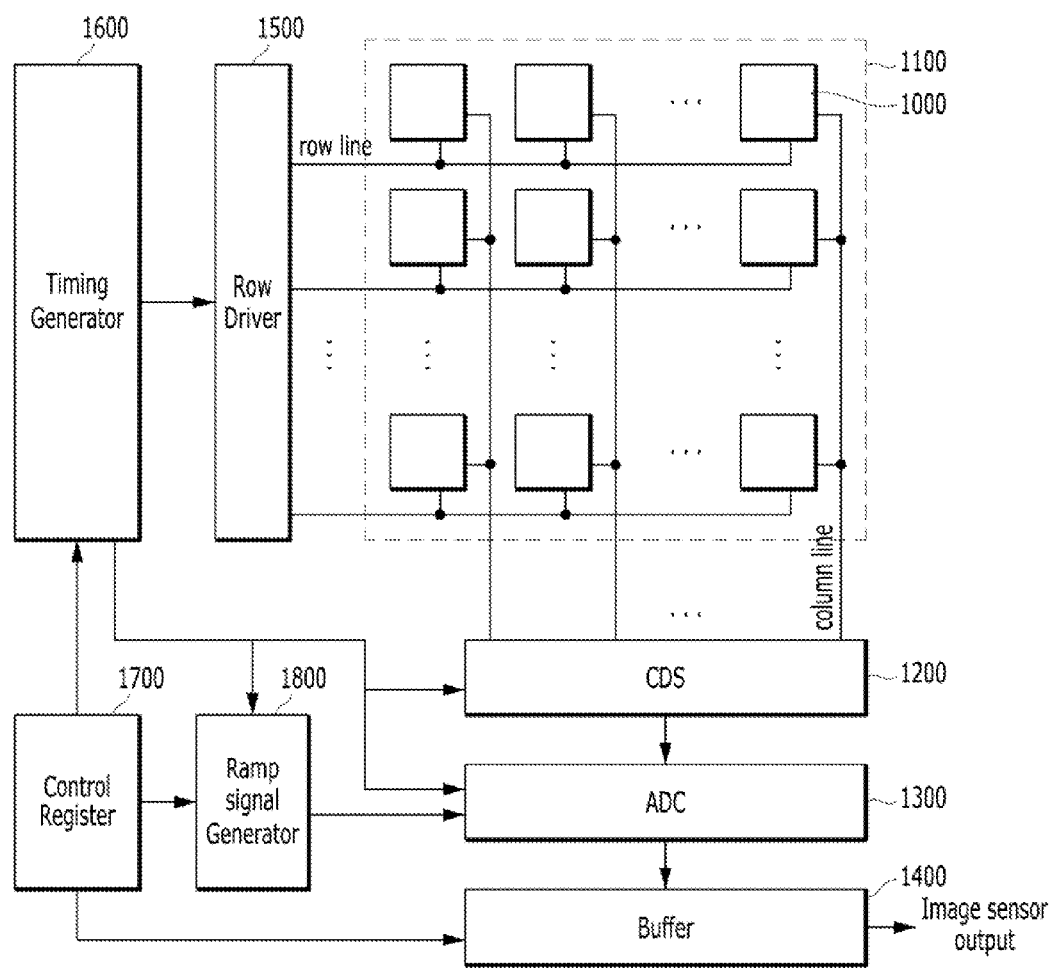
FIG. 1 is a diagram schematically illustrating an image sensor in accordance with embodiments of the present invention.

Various embodiment s will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

The drawings are not necessarily to scale and, in some instances, proportions may have been exaggerated to clearly illustrate features of the embodiments. When a first layer is referred to as being 'on' a second layer or 'on' a substrate, it not only refers to where the first layer is formed directly on the second layer or the substrate but also to where a third layer exists between the first layer and the second layer or the substrate.

In accordance with exemplary embodiments of the present invention, an image sensor is provided with improved shading variation in a higher optical field, which is increased as an 'F' number of a module lens is decreased. When a pixel array is expressed by a field, the center of the pixel array may be expressed as a '0' field, and the most remote location from the center of the pixel array, that is, an end of the pixel array in a diagonal direction may be expressed as a '1' field. Accordingly, the higher optical field may indicate an outer field that is more remote from the center of the pixel array in an edge direction.

The shading variation occurs as the size of a unit pixel is gradually shrunk and the chief ray angle (CRA) is gradually increased, and serves as a direct factor in degrading image quality. In detail, the shading variation occurs due to the difference in the amount of light that varies according to locations of the pixel array as the size of the unit pixel is shrunk and the CRA is increased. That is, the shading variation may be increased with an increase in the difference of incident light that fall on unit pixels located at the center of the pixel array versus the edge of the pixel ray. In some high pixel product groups, the shading variation is corrected through image processing such as lens shading correction, which may not be the best solution for improving the shading variation.

Image sensors convert an optical image into electric signals and may be classified as either charge coupled devices (CCD) or complementary metal oxide semiconductor image sensor (CIS). The CIS image sensors have a driving scheme that is simpler than that of the CCD image sensors and may employ various scanning schemes. Furthermore, CIS circuits for signal processing may be easily integrated into a single chip through a CMOS process, less power is consumed, and fabricating costs may be lowered. The CIS image sensors may be classified into the front-side illumination type and the back-side illumination type. The back-side illumination typed CIS may achieve superior operation characteristics, for example, greater sensitivity, as compared with the front-side illumination type CIS. Accordingly, the following embodiments will be described using back-side illumination type CIS image sensors as an example.

FIG. 1 is a diagram schematically illustrating an image sensor in accordance with embodiments of the present invention.

As illustrated in FIG. 1, the image sensor in accordance with the embodiments may include a pixel array 1100, a correlated double sampler (CDS) 1200, an analog-to-digital converter (ACD) 1300, a buffer 1400, a row driver 1500, a timing generator 1600, a control register 1700 and a ramp signal generator 1800.

The pixel array 1100 may be a two-dimensional array of a plurality of unit pixels 1000. In the pixel array 1100, a plurality of red pixels R, a plurality of green pixels G, and a plurality of blue pixels B may be arranged in an RG/GB Bayer pattern. Each of the plurality of unit pixels 1000 may have a rectangular planar shape and may be arranged in a matrix structure. Although not illustrated in the drawing, each of the plurality of unit pixels 1000 may also have a hexagonal or circular planar shape and may also be arranged in a honeycomb structure.

The timing generator 1600 may generate one or more control signals for controlling respective operations of the row driver 1500, the correlated double sampler 1200, the analog-to-digital converter 1300, and the ramp signal generator 1800. The control register 1700 may generate one or more control signals for controlling respective operations of the ramp signal generator 1800, the timing generator 1600, and the buffer 1400.

The row driver 1500 may drive the pixel array 1100 in units of row lines. For example, the row driver 1500 may generate a selection signal for selecting any one of a plurality of row lines. Each of the plurality of unit pixels 1000 may sense incident light, and may output an image reset signal and an image signal to the correlated double sampler 1200 through a column line. The correlated double sampler 1200 may perform sampling for the received image reset signal and image signal.

The analog-to-digital converter 1300 may compare a ramp signal outputted from the ramp signal generator 1800 with a sampling signal outputted from the correlated double sampler 1200, and may output a comparison signal. The analog-to-digital converter 1300 may count a level transition time of the comparison signal according to a clock signal provided from the timing generator 1600, and may output a count value to the buffer 1400. The ramp signal generator 1800 may operate under the control of the timing generator 1600.

The buffer 1400 may store each of a plurality of digital signals outputted from the analog-to-digital converter 1300, and then sense, amplify, and output these digital signals. Accordingly, the buffer 1400 may include a memory (not illustrated) and a sense amplifier (not illustrated). The memory stores the count value associated with signals outputted from the plurality of unit pixels 1000. The sense amplifier may sense and amplify respective count values outputted from the memory.

Figure 2:
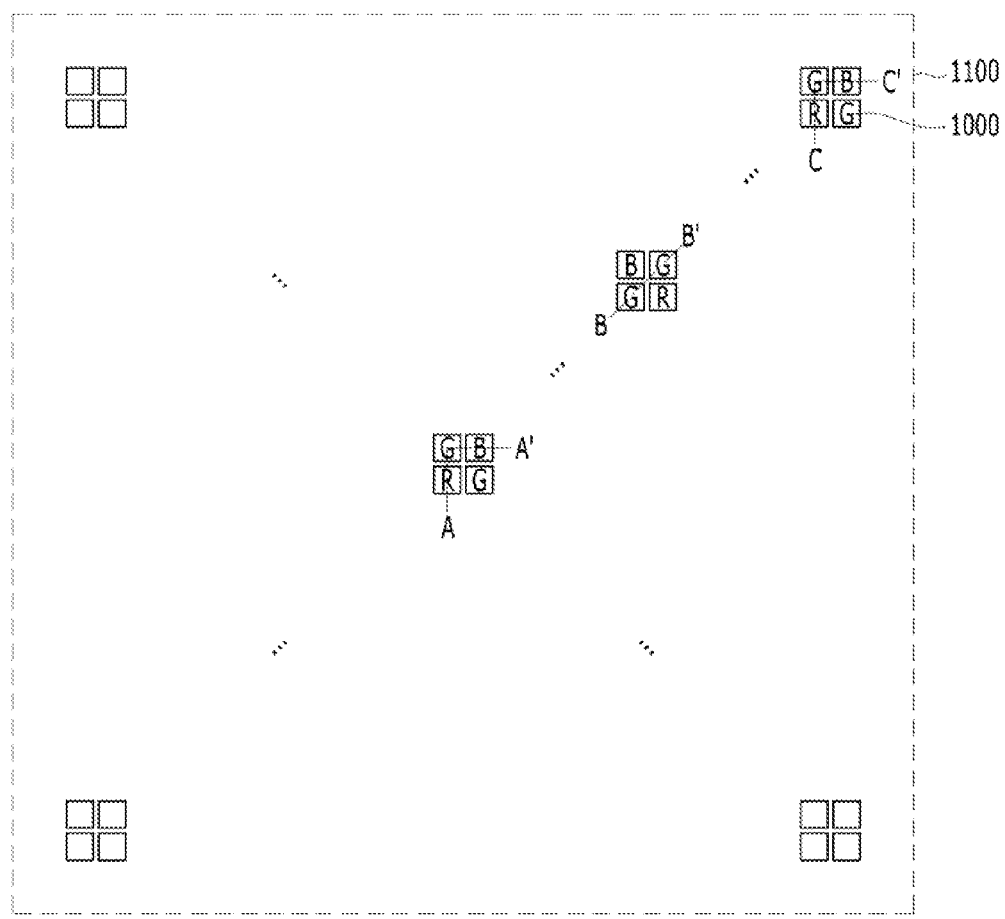
FIG. 2 is a plan view illustrating a pixel array of an image sensor in accordance with exemplary embodiments of the present invention.
Figure 3:
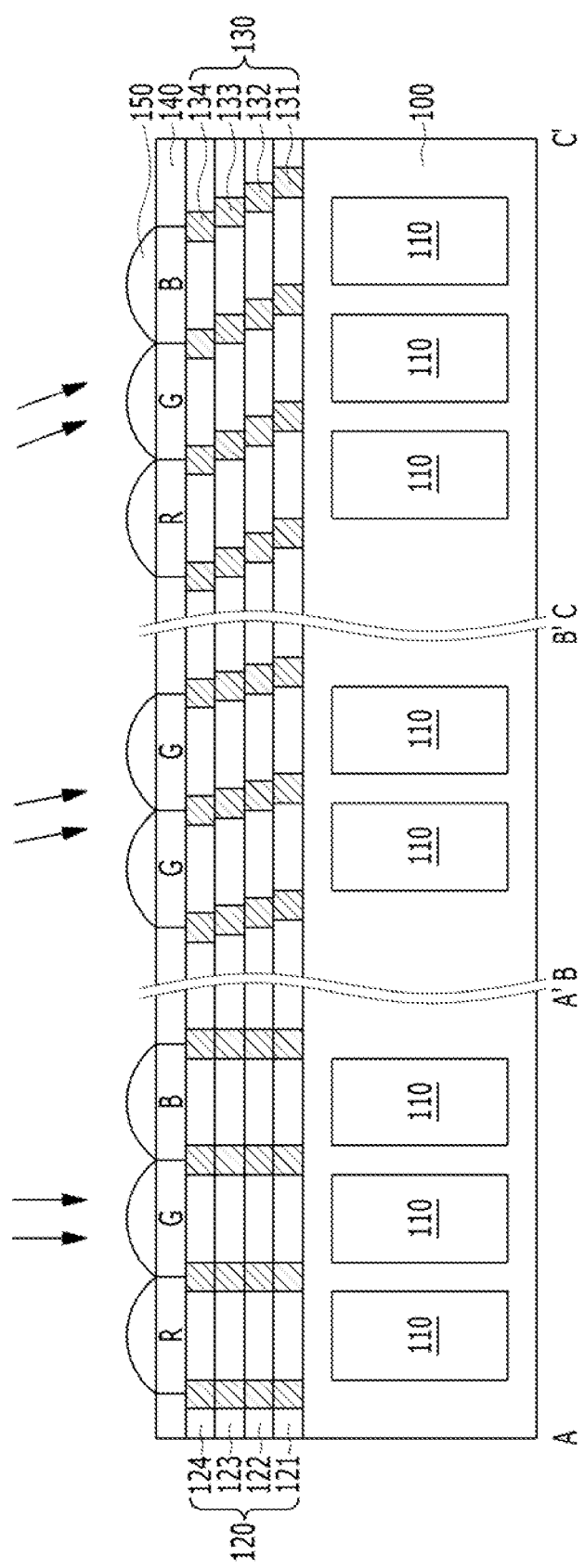
FIG. 3 is a first example of a cross-sectional view of a pixel array shown in FIG. 2.

In accordance with exemplary embodiments of the present invention, the image sensor may include a grid structure tilted for respective CRAs of the plurality of unit pixels 1000 according to location in the pixel array 1100. The grid structure tilted for the respective CRAs of the plurality of unit pixels 1000 may improve the shading variation, may prevent crosstalk between adjacent unit pixels 1000, and may increase quantum efficiency. FIG. 2 is a plan view illustrating a pixel array of an image sensor in accordance with exemplary embodiments of the present invention, and FIG. 3 is a first example of a cross-sectional view of the pixel array 1100 shown in FIG. 2. FIG. 3 shows three unit pixels, each cross-sectional view of which are taken along lines A-A', B-B' and C-C' as shown in FIG. 2. Arrows illustrated in FIG. 3 indicate paths of incident light.

As illustrated in FIG. 2 and FIG. 3, the image sensor may include a substrate 100 including photoelectric conversion elements 110 respectively formed for a plurality of unit pixels 1000, a light transmission member 120 formed on the substrate 100, a grid structure 130 formed in the light transmission member 120 and having a multilayer structure in which a plurality of grid layers 131 to 134 are stacked, a color filter layer 140 formed on the light transmission member 120, and a light collection member 150 formed on the color filter layer 140.

The substrate 100 may include a semiconductor substrate. The semiconductor substrate may be in a single crystal state and include a silicon-containing material. That is, the substrate 100 may include a single crystal silicon-containing material.

The photoelectric conversion element 110 may include a photodiode. For example, the photoelectric conversion element 110 formed in the substrate 100 may include a plurality of photoelectric conversion layers (not illustrated) that overlap vertically, wherein each of the plurality of photoelectric conversion layers may be a photodiode including an N type impurity region and a P type impurity region.

The light transmission member 120 formed on the substrate 100 may provide a space for the grid structure 130. The light transmission member 120 may have a multilayer structure corresponding to the grid structure 130, and include an insulating material. For example, in the light transmission member 120, a plurality of insulating layers having substantially the same refractive index or different refractive indexes are stacked. In detail, as illustrated in the drawing, the light transmission member 120 may be formed by stacking first to fourth insulating layers 121 to 124 on the substrate 100. The first to fourth insulating layers 121 to 124 may be substantially the same insulating layer. Accordingly, the first to fourth insulating layers 121 to 124 may have substantially the same refractive index. Meanwhile, the first to fourth insulating layers 121 to 124 may have different refractive indexes. In this case, the refractive indexes of the first to fourth insulating layers 121 to 124 may become larger toward the photoelectric conversion element 110 in order to prevent light loss and increase light collection efficiency. In detail, the fourth insulating layer 124 may have the lowest refractive index, the first insulating layer 121 may have the highest refractive index. A change in the refractive indexes among the first to fourth insulating layers 121 to 124 may be non-linear when the first to third insulating layers 121 to 123 have substantially the same refractive index and the fourth insulating layer 124 has the lowest refractive index.

The grid structure 130 may be located among the plurality of unit pixels 1000 in order to prevent loss of incident light propagated from the light collection member 150 to the photoelectric conversion elements 110. In addition, the grid structure 130 may be located among the plurality of unit pixels 1000 in order to prevent crosstalk between adjacent unit pixels 1000.

Furthermore, in order to improve shading variation, the grid structure 130 may have a multilayer structure in which the plurality of grid layers 131 to 134 are stacked. For example, the grid structure 130 may include the first to fourth grid layers 131 to 134 formed in the first to fourth insulating layers 121 to 124, respectively. The first to fourth grid layers 131 to 134 may have substantially the same planar shape and line width regardless of theft location in the pixel array 1100. That is, light receiving areas provided by the grid structure 130 may be substantially equal regardless of their location of the pixel array 1100. Furthermore, the first to fourth grid layers 131 to 134 may have substantially the same planar shape and line width regardless of the type of pixels, that is, a red pixel, a green pixel, and a blue pixel. That is, the light receiving areas provided by the grid structure 130 may be substantially equal regardless of the type of pixels. The planar shapes of the first to fourth grid layers 131 to 134 may be substantially the same as respective planar shapes of the plurality of unit pixels 1000.

Furthermore, in order to improve shading variation, the grid structure 130 may be tilted for respective CRAs of the plurality of unit pixels 1000 according to location in the pixel array 1100. Sidewalls of the grid structure 130 may be inclined with slopes corresponding to the respective CRAs of the plurality of unit pixels 1000. In detail the grid structure 130 of the unit pixel 1000 located at the center of the pixel array 1100 may have vertical sidewalls because the incident light is vertical. Since the incident light becomes oblique and thus the incident angle becomes greater toward the edge of the pixel array 1100, the sidewalls of the grid structure 130 of the unit pixels 1000 may become more inclined or tilted as the location of the unit pixels 1000 becomes further from the center of the pixel array 1100. In this case, since the CRA is gradually increased from the center to the edge of the pixel array 1100, the slope of the sidewall of the grid structure 130 may be gradually increased in correspondence to the CRA.

Among the plurality of grid layers 131 to 134 of the grid structure 130 tilted for the respective CRAs of the plurality of unit pixels 1000 according to location in the pixel array 1100, a lower grid layer may be disposed closer to the edge of the pixel array 1100 than an upper grid layer as the location of the unit pixels 1000 gets further from the center of the pixel array 1100. The grid structure 130 of the unit pixel 1000 located at the center of the pixel array 1100 may have vertically stacked grid layers 131 to 134. The grid structure 130 of the unit pixel 1000 located at the edge of the pixel array 1100 may have the most inclined or tilted grid layers 131 to 134 so that a lower grid layer is disposed closer to the edge of the pixel array 1100 than an upper gird layer. As the location of the unit pixels 1000 is further from the center of the pixel array 1100, the discrepancy in dispositions between the lower grid layer and the upper grid layer may gradually increase and thus the amount of inclination or tilt of the plurality of grid layers 131 to 134 of the grid structure 130 of the unit pixel 1000 may become greater.

Furthermore, the shape of the grid structure 130 may depend on the planar shapes and the arrangement of the plurality of unit pixels 1000 in the pixel array 1100. For example, when the plurality of unit pixels 1000 each have a rectangular planar shape and are arranged in a matrix structure, the grid structure 130 corresponding to the plurality of unit pixels 1000 may also have a rectangular planar shape and may be arranged in a mesh structure. For example, when the plurality of unit pixels 1000 each have a circular planar shape and are arranged in a honeycomb structure, the grid structure 130 corresponding to the plurality of unit pixels 1000 may also have a circular planar shape and may be arranged in a honeycomb structure.

Furthermore, the grid structure 130 may include a metal material. For example, the grid structure 130 may have tungsten. Since the grid structure 130 includes a metal material, it is possible to effectively prevent crosstalk between adjacent unit pixels 1000.

The color filter layer 140 may include a plurality of color filters. For example, the color filter layer 140 may include three or more color filters selected from the group consisting of a red filter, a green filter, a blue filter, a cyan filter, a yellow filter, a magenta filter, a black filter, and a white filter. In detail, in the color filter layer 140, the red filter R, the green filter G, and the blue filter B may be arranged in the Bayer pattern. Respective edges of the plurality of color filters in the color filter layer 140 may overlap the grid structure 130. In more detail, in the grid structure 130, the uppermost grid layer, for example, the fourth grid layer 134 may overlap the edge of the color filter. The light collection member 150 may include a hemisphere micro-lens.

In accordance an embodiment of the present invention, the image sensor may include the grid structure 130 tilted for respective CRAs of the plurality of unit pixels 1000 according to location in the pixel array 1100, thereby improving shading variation. As the shading variation is improved, it is possible to increase quantum efficiency of the unit pixels 1000 located at the edge of the pixel array 1100. The grid structure 130 may increase the amount of incident light into the unit pixels 1000 located at the edge of the pixel array 1100. Furthermore, the grid structure 130 including the metal material may prevent crosstalk between adjacent unit pixels 1000.

Figure 4:
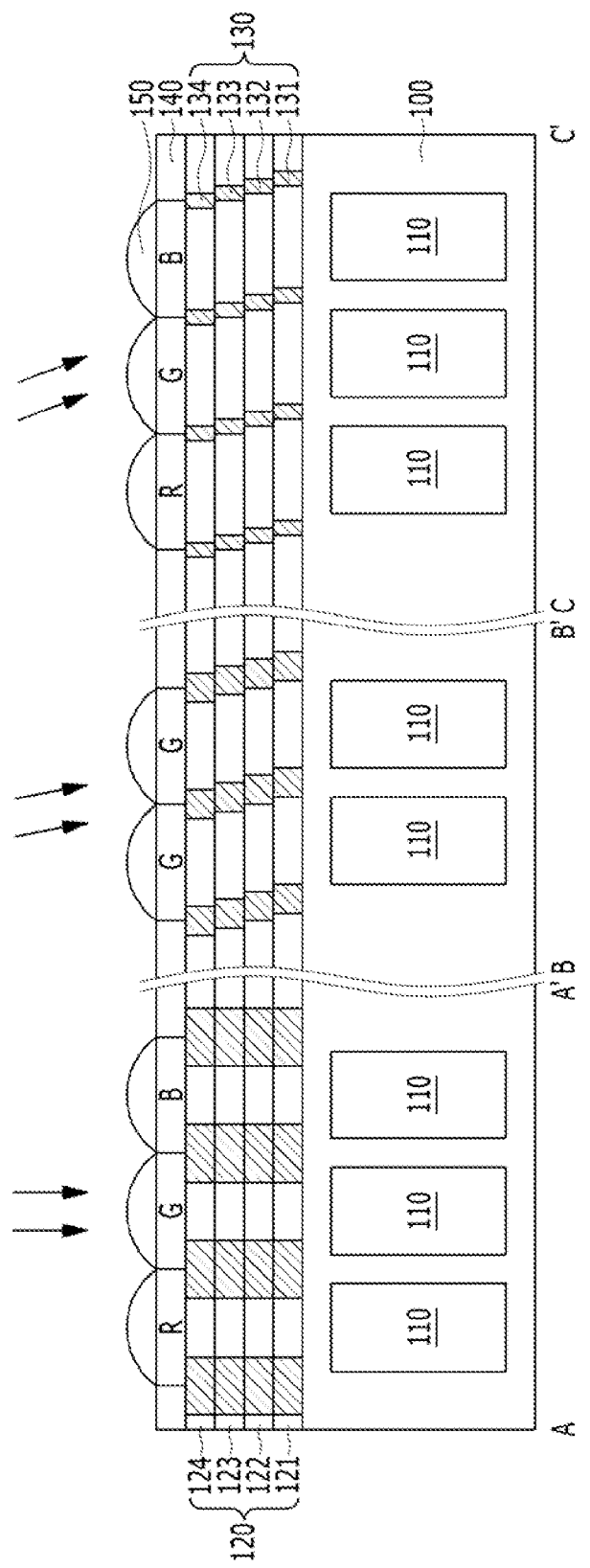
FIG. 4 is a second example of a cross-sectional view of a pixel array shown in FIG. 2.

FIG. 4 is a second example of a cross-sectional view of a pixel array 1100 shown in FIG. 2. FIG. 4 shows three unit pixels, each cross-sectional view of which are taken along lines A-A', B-B', and C-C' as shown in FIG. 2. The second example shown in FIG. 4 may be the same as the first example described with reference to FIGS. 1 to 3 except for line widths of the grid structure 130.

As illustrated in FIG. 2 and FIG. 4, in the image sensor, the line widths of the grid structure 130 tilted for respective CRAs of the plurality of unit pixels 1000 according to location in the pixel array 1100 may be different depending on their location in the pixel array 1100.

As shown in the first example of FIG. 3, the grid structure 130 may have the same planar shape and line width regardless of location in the pixel array 1100. According to the first example, the light receiving areas provided by the grid structure 130 may be equal regardless of location of the pixel array 1100.

As shown in the second example of FIG. 4, the grid structure 130 may have the same planar shape regardless of the location in the pixel array 1100 but the line widths of the grid structure 130 may become narrower as the location of the unit pixels 1000 gets further from the center to the edge of the pixel array 1100. Accordingly, the light receiving areas provided by the grid structure 130 may become greater as the location of the unit pixels 1000 gets further from the center of the pixel array 1100. Since the light receiving areas provided by the grid structure 130 are greatest in the edge of the pixel array 1100, it is possible to further reduce the difference in the amount of incident light among the unit pixels 1000. Consequently, it is possible to improve shading variation more effectively.

Also, the light receiving areas provided by the grid structure 130 may be different from one another according to the type of pixels. For example the light receiving area of a green pixel may be the largest and the light receiving area of a red pixel may be the smallest. The light receiving areas provided by the grid structure 130 may be different depending on the type of pixels in the entire pixel array 1100 or the part of the pixel array 1100. The different refractive indexes of materials and the different light receiving areas according to the color filters may prevent loss of short wavelength light (i.e., for the blue pixel) and crosstalk of long wavelength light (i.e., for the read pixel).

Figure 5:
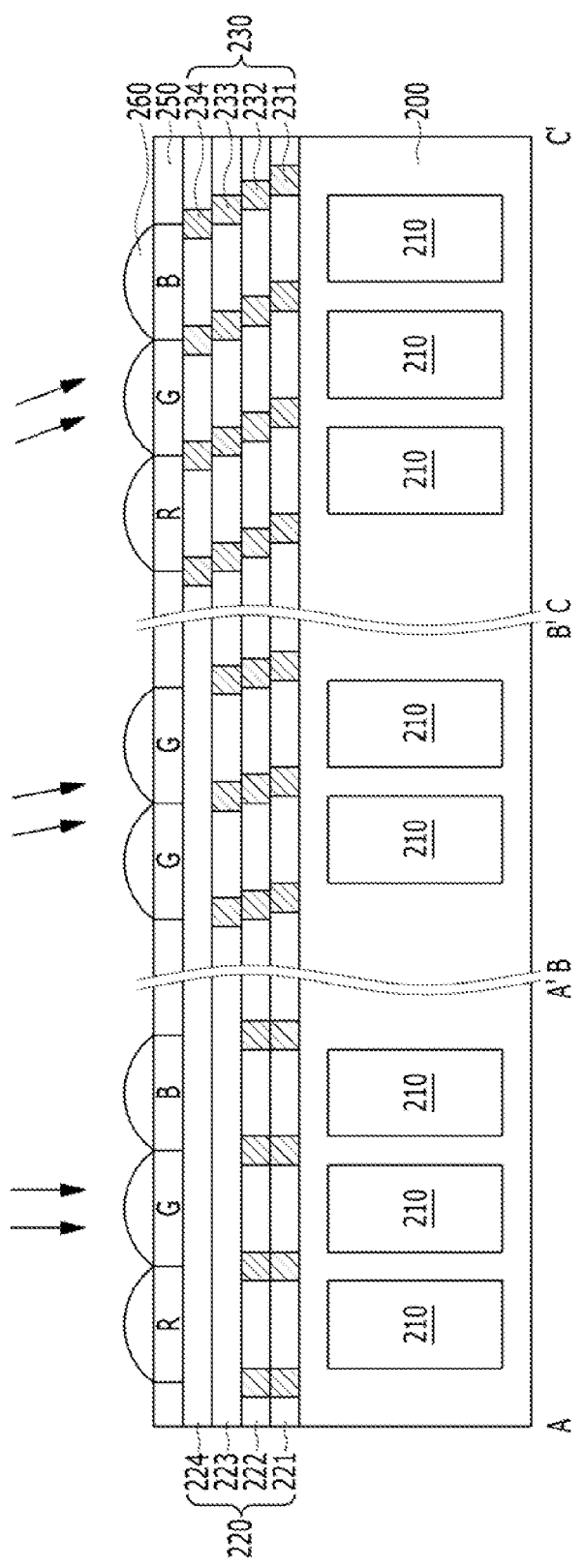
FIG. 5 is a third example o a cross-sectional view of a pixel array shown in FIG. 2.

FIG. 5 is a third example of a cross-sectional view of a pixel array shown in FIG. 2. FIG. 5 shows three unit pixels, each cross-sectional view of which are taken along lines A-A', B-B', and C-C' as shown in FIG. 2. Arrows illustrated in FIG. 5 indicate paths of incident light As illustrated in FIG. 2 and FIG. 5, the image sensor may include a substrate 200 including photoelectric conversion elements 210 respectively formed for a plurality of unit pixels 1000, a light transmission member 220 formed on the substrate 100, a grid structure 230 formed in the light transmission member 220 and having a multilayer structure in which a plurality of grid layers 231 to 234 are stacked, a color filter layer 250 formed on the light transmission member 220, and a light collection member 260 formed on the color filter layer 250. The grid structure 230 may be formed among the plurality of unit pixels 1000 and may be tilted for respective CRAs of the plurality of unit pixels 1000 according to location in the pixel array 1100. Furthermore, the number of layers of the grid structure 230 may increase as the location of the unit pixels 1000 becomes further from the center to the edge of the pixel array 1100.

The substrate 200 may include a semiconductor substrate. The semiconductor substrate may have a single crystal state and include a silicon-containing material. That is, the substrate 200 may include a single crystal silicon-containing material.

The photoelectric conversion element 210 may include a photodiode. For example, the photoelectric conversion element 210 formed in the substrate 200 may include a plurality of photoelectric conversion layers (not illustrated) vertically overlapping one another, wherein each of the plurality of photoelectric conversion layers may be a photodiode including an N type impurity region and a P type impurity region.

The light transmission member 220 formed on the substrate 200 may provide a space for the grid structure 230. For the grid structure 230 having multiple layers, the light transmission member 220 may have a multilayer structure, which is similar to the grid structure 230, and includes an insulating material. For example, as illustrated in the drawing, the light transmission member 220 may be formed by stacking first to fourth insulating layers 221 to 224 on the substrate 100. The first to fourth insulating layers 221 to 224 may be substantially the same. Accordingly, the first to fourth insulating layers 221 to 224 may have substantially the same refractive index. The first to fourth insulating layers 221 to 224 may have different refractive indexes. In this case, the refractive indexes of the first to fourth insulating layers 221 to 224 may be larger toward the photoelectric conversion element 210 in order to prevent light loss and increase light collection efficiency. In detail, the fourth insulating layer 224 may have the lowest refractive index, the first insulating layer 221 may have the highest refractive index. A change in the refractive indexes among the first to fourth insulating layers 221 to 224 may be non-linear when the first to third insulating layers 221 to 223 have substantially the same refractive index and the fourth insulating layer 224 has the lowest refractive index.

The grid structure 230 may be located among the plurality of unit pixels 1000 in order to substantially prevent loss of incident light propagated from the light collection member 260 to the photoelectric conversion elements 210. In addition, the grid structure 230 may be located among the plurality of unit pixels 1000 in order to substantially prevent crosstalk between adjacent unit pixels 1000.

Furthermore, in order to improve shading variation, the grid structure 230 may have the multilayer structure in which the plurality of grid layers 231 to 234 are stacked. For example, the grid structure 230 may include the first to fourth grid layers 231 to 234 formed in the first to fourth insulating layers 221 to 224, respectively. The first to fourth grid layers 231 to 234 may have substantially the same planar shape and line width regardless of location in the pixel array 1100. That is, light receiving areas provided by the grid structure 230 may be substantially equal regardless of location in the pixel array 1100. Furthermore, the first to fourth grid layers 231 to 234 may have substantially the same planar shape and line width regardless of color type. That is, the light receiving areas provided by the grid structure 230 may be substantially equal regardless of the type of pixels. The planar shapes of the first to fourth grid layers 231 to 234 may be substantially the same as respective planar shapes of the plurality of unit pixels 1000.

Furthermore, in order to improve shading variation, the grid structure 230 may be tilted for respective CRAs of the plurality of unit pixels 1000 according to location in the pixel array 1100. According to the tilted shape, sidewalls of the grid structure 230 may be inclined with slopes corresponding to the respective CRAs of the plurality of unit pixels 1000. In detail, the grid structure 230 of the unit pixel 1000 located at the center of the pixel array 1100 may have vertical sidewalls because the incident light is vertical. Since the incident light becomes more oblique and thus the incident angle becomes greater toward the edge of the pixel array 1100, the sidewalls of the grid structure 230 of the unit pixels 1000 may become more inclined or tilted as the location of the unit pixels 1000 gets further from the center to the edge of the pixel array 1100. In this case, since the CRA is gradually increased from the center to the edge of the pixel array 1100 the slope of the sidewall of the grid structure 230 may be gradually increased in correspondence to the CRA.

Among the plurality of grid layers 231 to 234 of the grid structure 230 tilted for the respective CRAs of the plurality of unit pixels 1000 according to location in the pixel array 1100, a lower grid layer may be disposed closer to the edge of the pixel array 1100 than an upper gird layer as the location of the unit pixels 1000 becomes further from the center of the pixel array 1100. The grid structure 230 of the unit pixel 1000 located at the center of the pixel array 1100 may have the vertically stacked grid layers 231 to 234. The grid structure 230 of the unit pixel 1000 located at the edge of the pixel array 1100 may have the most inclined or tilted grid layers 231 to 234 so that a lower grid layer is disposed closer to the edge of the pixel array 1100 than an upper gird layer. As the location of the unit pixels 1000 becomes further from the center of the pixel array 1100, the discrepancy in dispositions between the lower grid layer and the upper gird layer may be gradually increased and thus the amount of inclination or tilt of the plurality of grid layers 231 to 234 of the grid structure 230 of the unit pixel 1000 may become greater.

Furthermore, in order to improve the shading variation more effectively, the number of layers of the grid structure 230 may increase as the location of the unit pixels 1000 gets further from the center of the pixel array 1100. For example, the grid structure 230 located at the center of the pixel array 1100 may have the first and second grid layers 231 and 232 while the grid structure 230 located at the edge of the pixel array 1100 may have the first to fourth grid layers 231 and 234. The increase n the number of layers of the grid structure 230 may be non-linear.

Furthermore, the shape of the grid structure 230 may depend on the planar shapes and the arrangement of the plurality of unit pixels 1000 in the pixel array 1100. For example, when the plurality of unit pixels 1000 each have a rectangular planar shape and are arranged in a matrix structure, the grid structure 230 corresponding to the plurality of unit pixels 1000 may also have a rectangular planar shape and may be arranged in a mesh structure. For example, when the plurality of unit pixels 1000 each have a circular planar shape and are arranged in a honeycomb structure, the grid structure 230 corresponding to the plurality of unit pixels 1000 may also have a circular planar shape and may be arranged in a honeycomb structure.

Furthermore, the grid structure 230 may include a metal material. For example, the grid structure 230 may have tungsten. Since the grid structure 230 includes a metal material, it is possible to effectively prevent crosstalk between adjacent unit pixels 1000.

The color filter layer 250 may include a plurality of color filters. For example, the color filter layer 250 may include three or more color filters selected from the group consisting of a red filter, a green filter, a blue filter, a cyan filter, a yellow filter, a magenta filter, a black filter, and a white filter. In detail, in the color filter layer 250, the red filter R, the green filter G, and the blue filter B may be arranged in the Bayer pattern. Respective edges of the plurality of color filters in the color filter layer 250 may overlap the grid structure 230. In more detail, in the grid structure 230, the uppermost grid layer, for example, the fourth grid layer 234 may overlap the edge of the color filter. The light collection member 260 may include a hemisphere micro-lens.

In accordance with an embodiment of the present invention, the image sensor may include the grid structure 230 tilted for respective CRAs of the plurality of unit pixels 1000 according to location in the pixel array 1100 thereby improving shading variation. Furthermore, the grid structure 230 has a different number of layers depending on the location in the pixel array 1100, and it is possible to improve the shading variation more effectively. As the shading variation is improved, it is possible to increase quantum efficiency of the unit pixels 1000 located at the edge of the pixel array 1100. The grid structure 230 may increase the amount of incident light in the unit pixels 1000 located at the edge of the pixel array 1100. Furthermore, the grid structure 230 including the metal material may prevent crosstalk between adjacent unit pixels 1000.

Figure 6:
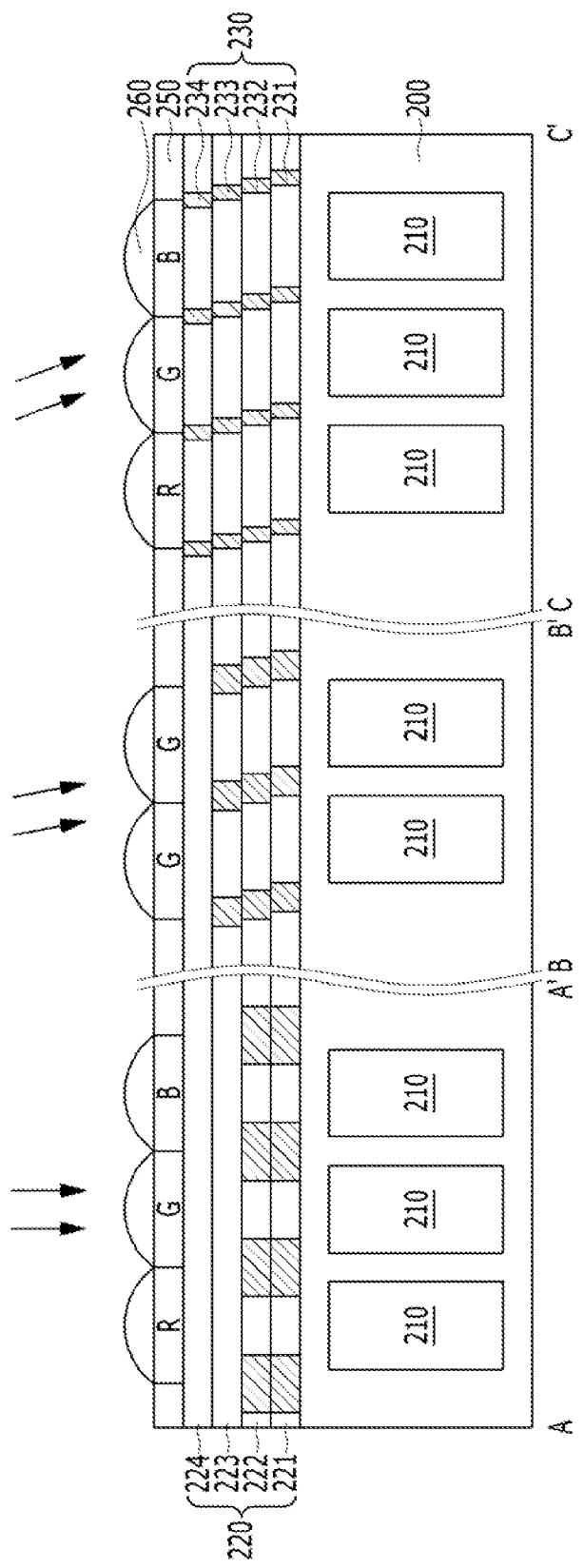
FIG. 6 is a fourth example of a cross-sectional view of a pixel array shown in FIG. 2.

FIG. 6 is a fourth example of a cross-sectional view of a pixel array 1100 shown in FIG. 2. FIG. 6 shows three unit pixels, each cross-sectional view of which are taken along lines A-A', B-B', and C-C' as shown in FIG. 2. The fourth example shown in FIG. 6 may be the same as the third example described with reference to FIGS. 1, 2 and 5 except for line widths of the grid structure 230.

As illustrated in FIG. 2 and FIG. 6, in the image sensor, the line widths of the grid structure 230 tilted for respective CRAs of the plurality of unit pixels 1000 according to location in the pixel array 1100 may be different depending on the location in the pixel array 1100.

As shown in the third example of FIG. 5, the grid structure 230 may have the same planar shape and line width regardless of location in the pixel array 1100. According to the third example, the light receiving areas provided by the grid structure 230 may be equal regardless of location in the pixel array 1100.

As shown in the fourth example of FIG. 6, the grid structure 230 may have the same planar shape regardless of location in the pixel array 1100 but the line widths of the grid structure 230 may become narrower as the location of the unit pixels 1000 becomes further from the center of the pixel array 1100. Accordingly, the light receiving areas provided by the grid structure 230 may become greater as the location of the unit pixels 1000 becomes further from the center of the pixel array 1100. Since the light receiving areas provided by the grid structure 230 are greatest in the edge of the pixel array 1100, it is possible to further reduce the difference in the amount of incident light among the unit pixels 1000. Consequently, it is possible to improve shading variation more effectively.

Also, the light receiving areas provided by the grid structure 230 may be different depending on the type of pixels. For example, the light receiving area of a green pixel may be the largest and the light receiving area of a red pixel may be the smallest. The light receiving areas provided by the grid structure 230 may be different depending on the type of pixels in the entire pixel array 1100 or a part of the pixel array 1100. The different refractive indexes of materials and the different light receiving areas according to the color filters may prevent loss of short wavelength light (i.e., for the blue pixel) and crosstalk of a long wavelength light (i.e., for the read pixel). In the image sensors in accordance with the aforementioned first embodiment and second embodiment and the modified examples thereof, the cases in which the grid structures 130 and 230 are tilted so as to correspond to respective CRAs of the plurality of unit pixels 1000 have been exemplified. However, the grid structures 130 and 230 may also be formed to have vertical sidewalls regardless of positions in the pixel array 1100. That is, the grid structures 130 and 230 formed at the center and the edge of the pixel array 1100 may also have substantially the same shape. However, in this case, incident light collected by passing through the light collection members 150 and 260 at the edge of the pixel array 1100 may be blocked by the grid structures 130 and 230 having vertical sidewalls. That is, shading variation may also be increased by the grid structures 130 and 230.

In order to improve side effects caused by the grid structures 130 and 230 positioned between the light collection members 150 and 260 and the photoelectric conversion elements 110 and 210, the grid structures 130 and 230 may also be formed between the light collection members 150 and 260. However, in this case, since the grid structures 130 and 230 are positioned before incident light is collected through the light collection members 150 and 260, it is disadvantageous in that the incident light may be lost, and it is not possible to cope with problems generated after the incident light passes through the fight collection members 150 and 260.

As a consequence, the image sensors in accordance with the aforementioned embodiments include the grid structures 130 and 230 tilted so as to correspond to respective CRAs of the plurality of unit pixels 1000 according to positions in the pixel array 1100 between the light collection members 150 and 260 and the photoelectric conversion elements 110 and 210, so that it is possible to effectively improve shading variation.

The image sensors in accordance with the aforementioned embodiments may be used in various electronic devices or systems. Hereinafter, with reference to FIG. 7, the case in which an image sensor in accordance with an embodiment of the present invention is applied to a camera will be described as an example.

Figure 7:
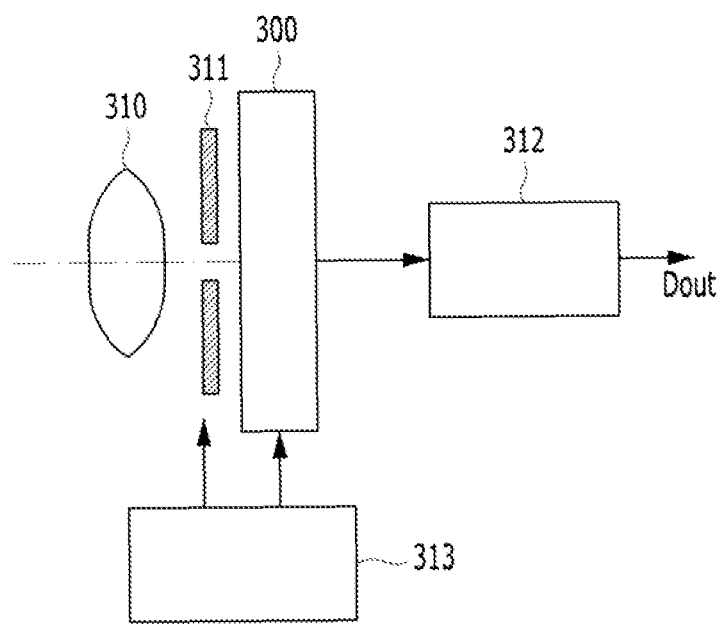
FIG. 7 is a diagram illustrating an electronic device having an image sensor in accordance with an embodiment of the present invention.

FIG. 7 is a diagram illustrating an electronic device having the image sensor in accordance with the embodiment of the present invention.

Referring to FIG. 7, the electronic device having the image sensor in accordance with the embodiments may include a camera capable of capturing a still image or a moving image. The electronic device may include an optical system 310 (or an optical lens), a shutter unit 311, a driving unit 313 that controls and drives an image sensor 300 and the shutter unit 311, and a signal processing unit 312.

The optical system 310 guides image light (incident light) from an object to a pixel array (see reference numeral '1000' of FIG. 1 and FIG. 2) of the image sensor 300. The optical system 310 may include a plurality of optical lenses. The shutter unit 311 controls light irradiation period and blocking period for the image sensor 300. The driving unit 313 controls a transmission operation of the image sensor 300 and a shutter operation of the shutter unit 311. The signal processing unit 312 performs various types of signal processing on a signal outputted from the image sensor 300. An image signal Dout subjected to the signal processing is stored in a storage medium such as a memory or is outputted to a monitor and the like.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
    a substrate including photoelectric conversion elements for a plurality of unit pixels which are two-dimensionally arranged in a pixel array;
    a light transmission member on the substrate;
    a grid structure in the light transmission member and having multiple layers; and
    a light collection member on the light transmission member,
    wherein the grid structure is tilted for respective chief ray angles of the unit pixels according to location in the pixel array.

2. The image sensor of claim 1, further comprising a color filter layer between the light transmission member and the light collection member and including a plurality of color filters,
    wherein respective edges of the plurality of color filters overlap an uppermost layer of the grid structure.

3. The image sensor of claim 1, wherein the light transmission member has multiple layers corresponding to the multiple layers of the grid structure.

4. The image sensor of claim 3,
    wherein each of the multiple layers of the light transmission member include an insulating material, and
    wherein refractive indexes of the multiple layers of the light transmission member are the same.

5. The image sensor of claim 3,
    wherein each of the multiple layers of the light transmission member include an insulating material, and
    wherein the multiple layers of the light transmission member having different refractive indexes are stacked such that each of the multiple layers has a larger refractive index toward the photoelectric conversion element.

6. The image sensor of claim 1,
    wherein the grid structure located at a center of the pixel array has vertical sidewalls, and wherein a tilt amount of sidewalls of the grid structure becomes greater as the location of the unit pixels gets further from the center of the pixel array.

7. The image sensor of claim 1, wherein the grid structure is located between the unit pixels.

8. The image sensor of claim 1, wherein a number of the multiple layers of the grid structure increases as the location of the unit pixels gets further from a center of the pixel array.

9. The image sensor of claim 1, wherein a line width of the grid structure decreases as the location of unit pixels gets further from a center of the pixel array.

10. The image sensor of claim 1, wherein the grid structure includes a metal material.

11. The image sensor of claim 1, wherein a planer shape of the grid structure is the same as respective planer shapes of the unit pixels.

12. An image sensor comprising:
a substrate including photoelectric conversion elements for a plurality of unit pixels, which are two-dimensionally arranged in a pixel array;
a light transmission member on the substrate;
a grid structure in the light transmission member and having a plurality of grid layers; and
a light collection member on the light transmission member,
wherein a lower grid layer becomes closer to an edge of the pixel array than an upper grid layer as the unit pixels get further from a center the pixel array.

13. The image sensor of claim 12, further comprising a color filter layer between the light transmission member and the light collection member and including a plurality of color filters,
wherein respective edges of the color filters overlap an uppermost layer of the grid structure.

14. The image sensor of claim 12,
wherein the grid structure located at the center of the pixel array has vertical sidewalls, and
wherein a tilt amount of sidewalls of the grid structure becomes greater as the unit pixels get further from the center of the pixel array.

15. The image sensor of claim 12, wherein the grid structure is located between the unit pixels.

16. The image sensor of claim 12, wherein a number of the multiple layers the grid structure increases as the unit pixels get further from the center of the pixel array.

17. The image sensor of claim 12, wherein a line width of the grid structure decreases as the unit pixels get further from the center of the pixel array.

18. The image sensor of claim 12, wherein the grid structure includes a metal material.

19. An electronic device comprising:
an optical system;
an image sensor suitable for receiving light from the optical system; and
a signal processing unit suitable for performing a signal processing operation on a signal outputted from the image sensor,
wherein the image sensor comprises:
a substrate including photoelectric conversion elements for a plurality of unit pixels, which are two-dimensionally arranged in a pixel array;
a light transmission member on the substrate;
a grid structure in the light transmission member and having a plurality of grid layers; and
a light collection member on the light transmission member,
wherein the grid structure is tilted for respective chief ray angles of the unit pixels according to where the plurality of unit pixels are located in the pixel array.

20. The electronic device of claim 19, wherein a lower grid layer is disposed closer to an edge of the pixel array than an upper gird layer among the plurality of the grid layers as the locations of the plurality of unit pixels become further from a center to the edge of the pixel array.

* * * * *